US010593718B2

(12) United States Patent
Tobiason (10) Patent No.: US 10,593,718 B2
(45) Date of Patent: Mar. 17, 2020

(54) SURFACE PROFILING AND IMAGING SYSTEM INCLUDING OPTICAL CHANNELS PROVIDING DISTANCE-DEPENDENT IMAGE OFFSETS

(71) Applicant: Mitutoyo Corporation, Kanagawa-ken (JP)

(72) Inventor: Joseph Daniel Tobiason, Bothell, WA (US)

(73) Assignee: Mitutoyo Corporation, Kanagawa-ken (JP)

( * ) Notice: Subject to any disclaimer, the term of this patent is extended or adjusted under 35 U.S.C. 154(b) by 269 days.

(21) Appl. No.: 15/471,811

(22) Filed: Mar. 28, 2017

(65) Prior Publication Data
US 2018/0286027 A1    Oct. 4, 2018

(51) Int. Cl.
*G02B 3/00*     (2006.01)
*H01L 27/146*   (2006.01)
*G01B 11/24*    (2006.01)
*G02B 21/06*    (2006.01)

(52) U.S. Cl.
CPC ........ *H01L 27/14627* (2013.01); *G01B 11/24* (2013.01); *H01L 27/14605* (2013.01)

(58) Field of Classification Search
CPC . G02B 3/0062; G02B 27/0075; H04N 13/232
USPC .................................. 348/92; 345/427, 417
See application file for complete search history.

(56) References Cited

U.S. PATENT DOCUMENTS

| 4,849,626 | A  | 7/1989  | Franklin, Jr.   |
|-----------|----|---------|-----------------|
| 6,542,180 | B1 | 4/2003  | Wasserman et al.|
| 6,791,072 | B1 | 9/2004  | Prabhu          |
| 6,849,843 | B2 | 2/2005  | Ansorge et al.  |
| 7,627,162 | B2 | 12/2009 | Blanford et al. |
| 7,636,204 | B1 | 12/2009 | Bourget         |
| 7,786,421 | B2 | 8/2010  | Nikzad et al.   |
| 7,792,423 | B2 | 9/2010  | Raskar et al.   |
| 8,111,938 | B2 | 2/2012  | Bryll et al.    |
| 8,334,971 | B2 | 12/2012 | Keller et al.   |

(Continued)

OTHER PUBLICATIONS

Broxton et al., "Wave Optics Theory and 3-D Deconvolution for the Light Field Microscope," *Stanford Computer Graphics Laboratory Technical Report 2013-1*, Jul. 25, 2013, 20 pages.

(Continued)

*Primary Examiner* — Albert Kir
(74) *Attorney, Agent, or Firm* — Seed IP Law Group LLP (57) ABSTRACT

A surface profiling system is provided including an imaging detector array and an optical imaging array comprising at least one set of optical channels. Each optical channel includes a lens arrangement (e.g., including a GRIN lens) configured to provide an erect image at a detector. The optical channels have overlapping fields of view (FOV) and overlapping imaged fields of view (IFOV). A workpiece surface point may be simultaneously imaged in at least two overlapping IFOVs of two optical channels. A surface point that is not at an object reference distance (e.g., a front focal length) may be imaged at different respective positions along the imaging detector array, and the difference between the respective positions may define a respective image offset for that surface point. A surface height measurement coordinate for the surface point may be determined based on the corresponding image offset.

21 Claims, 7 Drawing Sheets

(56) References Cited

U.S. PATENT DOCUMENTS

| | | | |
|---|---|---|---|
| 8,372,726 B2 | 2/2013 | de Graff et al. | |
| 8,570,505 B2 | 10/2013 | Baleine et al. | |
| 8,619,082 B1* | 12/2013 | Ciurea | H04N 13/232 |
| | | | 345/427 |
| 8,742,325 B1 | 6/2014 | Droz et al. | |
| 8,754,829 B2 | 6/2014 | Lapstun | |
| 9,412,172 B2 | 8/2016 | Sorkine-Hornung | |
| 9,906,771 B2* | 2/2018 | Kim | G02B 27/0075 |
| 9,945,988 B2* | 4/2018 | Powell | |
| 2010/0264502 A1 | 10/2010 | Christophersen et al. | |
| 2012/0261551 A1 | 10/2012 | Rogers | |
| 2013/0112881 A1 | 5/2013 | Rudolf | |
| 2016/0178534 A1 | 6/2016 | Shaffer | |
| 2016/0267665 A1 | 9/2016 | Venkataraman et al. | |

OTHER PUBLICATIONS

Ding, "Super Resolution Bore Imaging System," U.S. Appl. No. 15/186,231, filed Jun. 17, 2016, 35 pages.

"Gradient Index (GRIN) Lenses," GrinTech promotional material, revised Dec. 2015, 1 page.

Lee et al., "Distance Estimation with a Two or Three Aperture SLR Digital Camera," *ACIVS LNCS* 8192:25-36, 2013.

Ma et al., "Three-dimensional fluorescent microscopy via simultaneous illumination and detection at multiple planes," *Scientific Reports* 6:31445, 2016. (8 pages).

Mählert, "Contact Image Sensors (CIS) for High-Speed Optical Image Reading," *Stemmer Imaging*, Dec. 12, 2012, 14 pages.

Mignard-Debise et al., "Light-Field Microscopy with a Consumer Light-Field Camera," *2015 International Conference on 3D Vision*, Lyon, France, Oct. 19-22, 2015, pp. 335-343.

"SELFOC Lens Array (SLA) Reference Book," NSG, 22 pages.

"SELFOC® Lens Arrays for Line Scanning Applications," *Intelligent Opto Sensor Designer's Notebook 2*, 5 pages.

Soukup et al., "Depth Estimation within a Multi-Line-Scan Light-Field Framework," in Bebis et al. (eds.), *Proceedings of the 10$^{th}$ International Symposium on Visual Computing: Advances in Visual Computing Part II*, Las Vegas, Nevada, USA, Dec. 8-10, 2014, pp. 471-481.

\* cited by examiner

SURFACE PROFILING AND IMAGING SYSTEM INCLUDING OPTICAL CHANNELS PROVIDING DISTANCE-DEPENDENT IMAGE OFFSETS

BACKGROUND

Technical Field

This disclosure relates generally to precision metrology, and more particularly to surface profiling and imaging systems that may be utilized for determining surface height measurement coordinates for points on a surface of a workpiece that is being inspected.

Description of the Related Art

Various types of surface profiling systems are known that may be utilized for acquiring data regarding a surface (e.g., a surface of a workpiece that is being inspected). For example, various bore imaging systems are known that use a bore surface imaging arrangement for imaging the interior of a bore, for example in a cylinder bore of an engine. Exemplary bore inspection systems are disclosed in U.S. Pat. Nos. 4,849,626; 7,636,204; 8,334,971; 8,570,505; U.S. Patent Publication Nos. 2013/0112881; 2016/0178534; and U.S. patent application Ser. No. 15/186,231, filed Jun. 17, 2016, each of which is hereby incorporated herein by reference in its entirety. Such bore imaging systems may be configured to provide a 360-degree view (also referred to as a panoramic view and/or image) of the interior of a bore in order to inspect for form errors or surface defects. These systems may use signal processing to map image pixel signals or detector element signals to coordinates on the interior surface of the bore. In such systems, challenges may exist for determining highly accurate surface height measurement coordinates for workpiece surface points (e.g., due in part to the constrained spaces in which such systems may operate, etc.)

A high-resolution metrology-grade surface profiling system which is able to operate in constrained spaces and determine highly accurate surface height measurement coordinates for workpiece surface points would be desirable.

BRIEF SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

A surface profiling system is provided including an imaging detector array and an optical imaging array. The imaging detector array includes at least one set of detector pixels arrayed generally along the direction of a first array axis. The optical imaging array includes at least one set of optical channels, wherein the optical channels in a set are arrayed generally along the direction of the first array axis, and each optical channel is configured with its optical axis arranged transverse to the first array axis to input image light from a workpiece surface region located at an object distance along its optical axis in its field of view (FOV) and transmit the image light to a plurality of pixels of the imaging detector array located in its imaged field of view (IFOV). The detector pixels of the imaging detector array are arranged at a back imaging distance from the optical channels. Each optical channel includes a lens arrangement (e.g., including a GRIN lens) configured to provide an erect image in its IFOV for a workpiece surface located in its FOV and within a measuring range along the direction of the optical axes of the surface profiling system. The optical channels in a set are configured in the optical imaging array to have overlapping FOVs and overlapping IFOVs.

In various implementations, a workpiece surface point that is located in the measuring range may be simultaneously imaged in N overlapping IFOVs of N optical channels included in the set of optical channels, where N is an integer that is at least 2. In addition, a surface point that is located at a defined object reference distance from the N optical channels in the measuring range may be imaged at the same respective position along the imaging detector array in each of the N overlapping IFOVs. Furthermore, when a surface point is located at an object distance that is different than the object reference distance, then the surface point may be imaged at different respective positions at least along the direction of the first array axis in each of the N overlapping IFOVs, the difference between at least two of the respective positions defining a respective image offset for that surface point.

In various implementations, the surface profiling system includes a signal processing and control portion configured to perform various operations. Such operations may include acquiring image data provided by the imaging detector array and analyzing the image data to determine the respective image offset. The operations may also include providing a surface height measurement coordinate for the workpiece surface point along the direction of the optical axes based at least in part on the determined respective image offset.

DETAILED DESCRIPTION

Figure 1:
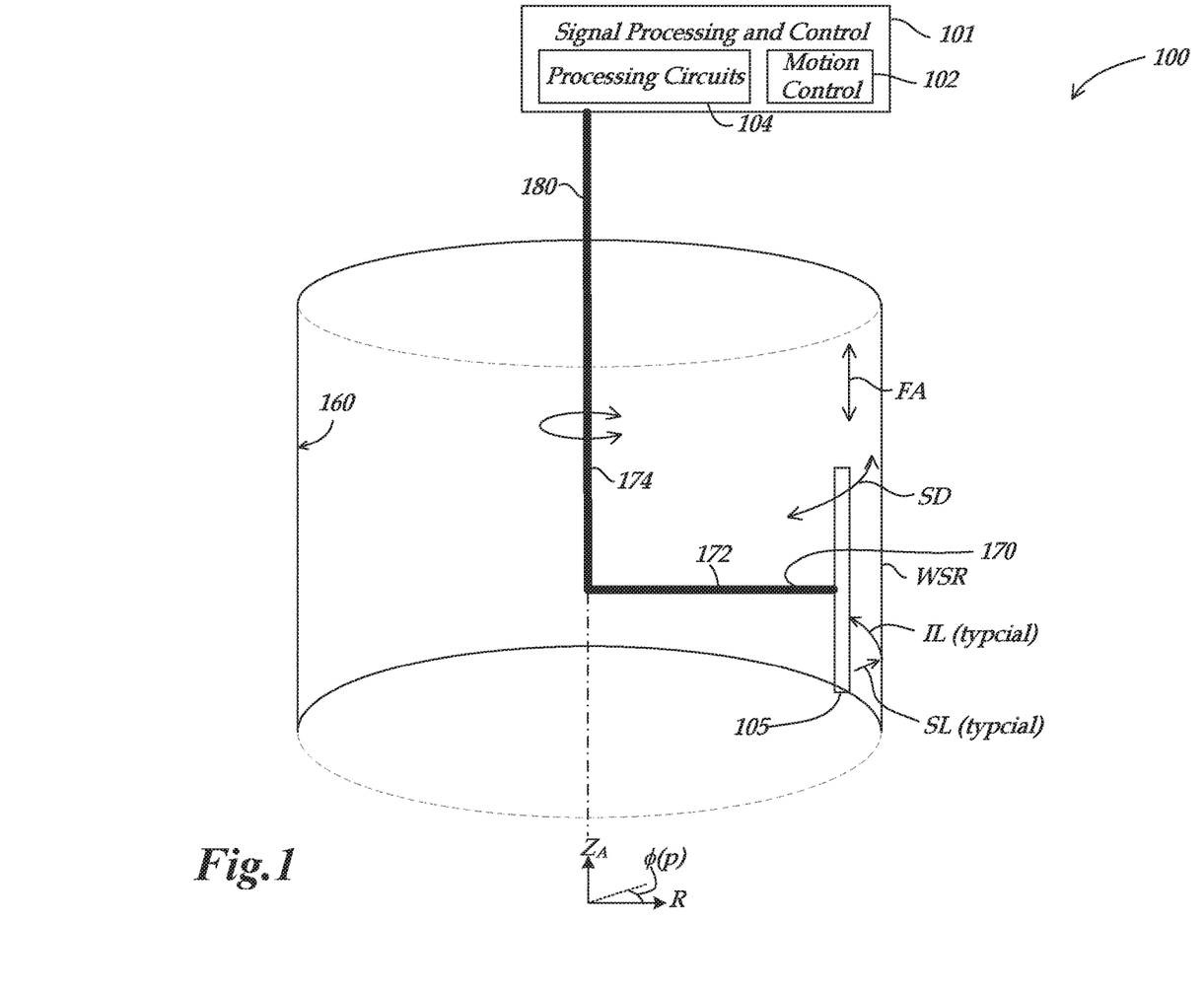
FIG. 1 is a diagram of a first exemplary implementation of a surface profiling system.

FIG. 1 is a diagram of a first exemplary implementation of a surface profiling system 100. As shown in FIG. 1, the surface profiling system 100 includes a signal processing and control portion 101, an imaging and detector configuration 105, a carrier 170 and a support portion 180. In various implementations, the carrier 170 may include an arm portion 172 that is attached to the imaging and detector configuration 105, and a central portion 174 that may be rotated about a central axis, as will be described in more detail below. In various implementations, the imaging and detector configuration 105 includes an imaging detector array and an optical imaging array, as will be described in more detail below with respect to FIGS. 3, 6A and 6B. The signal processing and control portion 101 includes a motion control portion 102 and processing circuits 104.

The carrier 170 may be mounted to or include a motion control system or the like (e.g., as controlled by the motion control portion 102) for rotating so as to scan the imaging and detector configuration 105 at the end of the arm portion 172 along a scanning direction SD (e.g., corresponding to an X axis direction as will be described in more detail below with respect to FIG. 3) to acquire image data for a desired workpiece surface region WSR (e.g., of a bore surface 160). In various implementations, the carrier 170 may also be moved axially by a motion control system for positioning the imaging and detector configuration 105 for scanning higher or lower workpiece surface regions of the bore surface 160. In various alternative implementations, the imaging and detector configuration 105 may be stationary for certain operations and/or adjustments, and the bore surface may be moved (e.g., on a stage for axial and/or rotary movement, etc.) in a manner measured and controlled by the surface profiling system 100, according to known methods.

In various implementations, the support portion 180 (e.g., including a central portion attached to the carrier 170) may be utilized to support and hold the carrier 170 in a steady centered relationship relative to the bore surface 160 while the carrier 170 is rotated. In various implementations, the arm portion 172 and central portion 174 of the carrier 170 may consist of hollow tubes that carry wires or other electrical connections (e.g., from the imaging and detector configuration 105 to the signal processing and control portion 101, etc.). In various implementations, the carrier 170 and/or support portion 180 may be lowered into the cylindrical bore and held by a structure from above (e.g., in a probe-type configuration). In various implementations, various sensors and/or trial scanning techniques (e.g., utilizing image data from the imaging and detector configuration 105 while it scans along the bore surface 160) may be utilized to determine if the support portion 180 and/or carrier 170 are properly centered within the cylindrical bore or if adjustments to the positioning are needed. In various implementations, FIG. 1 may be arranged according to cylindrical coordinates $Z_A$, R and ϕ which are aligned with the cylindrical bore, wherein $Z_A$ corresponds to an axial direction and ϕ (or "P") corresponds to the circumferential direction on the bore surface 160.

As will be described in more detail below, generally speaking a surface profiling system according to principles disclosed herein may comprise a set of detector pixels arrayed generally along the direction of a first array axis and an optical imaging array including at least one set of optical channels, wherein the optical channels in a set are arrayed generally along the direction of the first array axis and each optical channel is configured with its optical axis arranged transverse to the first array axis to input image light from a workpiece surface region located at an object distance along its optical axis in its field of view (FOV) and transmit the image light to a plurality of pixels of the imaging detector array located in its imaged field of view (IFOV). In the specific example shown in FIG. 1, the first array axis FA is straight and the optical imaging array of the imaging and detector configuration 105 may include at least one set of optical channels having approximately parallel optical axes, and the at least one set of optical channels may be arrayed generally along the direction of a first array axis FA which may generally be in the same direction as the axial direction $Z_A$ of the cylindrical bore. As noted above, the surface profiling system 100 may be configured to rotate the carrier 170 to cause the imaging and detector configuration 105 to scan along a workpiece surface region WSR of the bore surface 160 in the scan direction SD (i.e., which is transverse to the first array axis FA).

In various implementations, the optical channels of the imaging and detector configuration 105 are each configured to input image light IL from a workpiece surface region WSR of the bore surface 160 and transmit the image light IL to a plurality of pixels of the imaging detector array of the imaging and detector configuration 105. As will be described in more detail below with respect to FIG. 3, the imaging detector array includes at least one set of detector pixels arrayed generally along the direction of the first array axis FA. In various implementations, the pixels are formed of photodetector elements that provide image data (e.g., intensity values), which may be output individually, or in parallel, or multiplexed, or serialized, or otherwise processed before being output on designated connections (e.g., provided through the carrier 170, etc.). That is, in some implementations, the signal processing and control portion 101 may include processing circuits 104 that are provided as part of the imaging detector array and/or on the carrier 170 and which provide signals to other processing circuits 104 and/or other portions of the signal processing and control portion 101 via designated connections. In other implementations, the processing circuits 104 may be provided separately from the imaging detector array and/or carrier, and may receive pixel signals from the imaging detector array via the designated connections.

In various implementations, an illumination portion (not shown) is connected to an illumination power and control element, which may be provided as part of or in connection with the signal processing and control portion 101 (e.g., via an illumination/control line). In operation, the illumination portion is arranged to provide source light SL directed toward a workpiece surface region WSR of the bore surface 160, wherein the source light SL may be reflected from the workpiece surface region WSR as image light IL that is received by the optical channels of the imaging and detector configuration 105. More specifically, as will be described in more detail below with respect to FIGS. 3, 6A and 6B, the image light IL is received by a lens arrangement of each optical channel that is configured to provide an erect image of at least a portion of the workpiece surface region WSR in its imaged field of view IFOV. In various implementations, the illumination portion may be provided as part of the imaging and detector configuration 105 (e.g., as will be described in more detail below with respect to FIGS. 6A and 6B), or on the carrier 170, or as an independent element (e.g., a ring of illumination elements as will be described in more detail below with respect to FIG. 2), or in any other convenient form.

As will be described in more detail below with respect to FIG. 3, the optical channels of the imaging and detector configuration 105 may have overlapping fields of view FOV and overlapping imaged fields of view IFOV. A workpiece surface point in the workpiece surface region WSR may be simultaneously imaged in at least two or more overlapping IFOVs of two or more optical channels. A surface point that is not at an object reference distance may be imaged at different respective positions in the IFOVs, and the difference between the respective positions may define a respective image offset for that surface point. Corresponding image data may be analyzed by the signal processing and control portion 101 (e.g., by processing circuits 104) to determine the respective image offset. A surface height measurement coordinate for the surface point (e.g., as related to a distance between the surface point and the imaging and detector configuration 105) may be determined based on the determined image offset.

In various implementations, a workpiece surface point that is imaged in this manner may be one of multiple surface points that are imaged along the direction of the first array axis FA, and the signal processing and control portion 101 may further be configured to perform operations comprising determining respective coordinates for each of the multiple surface points. For example, respective surface height measurement coordinates for each of the multiple surface points may be determined based at least in part on determined respective image offsets for each of the multiple surface points. In various implementations, the signal processing and control portion 101 may further be configured to perform operations including constructing a synthetic image of the workpiece surface region WSR of the bore surface 160 wherein respective image offsets corresponding to a plurality of surface points are compensated and/or removed, and a majority of the synthetic image appears substantially focused. In various implementations, the signal processing and control portion 101 may be further configured to perform operations comprising determining contrast based Z-height information for at least a portion of the workpiece surface region WSR, as will be described in more detail below.

Figure 2:
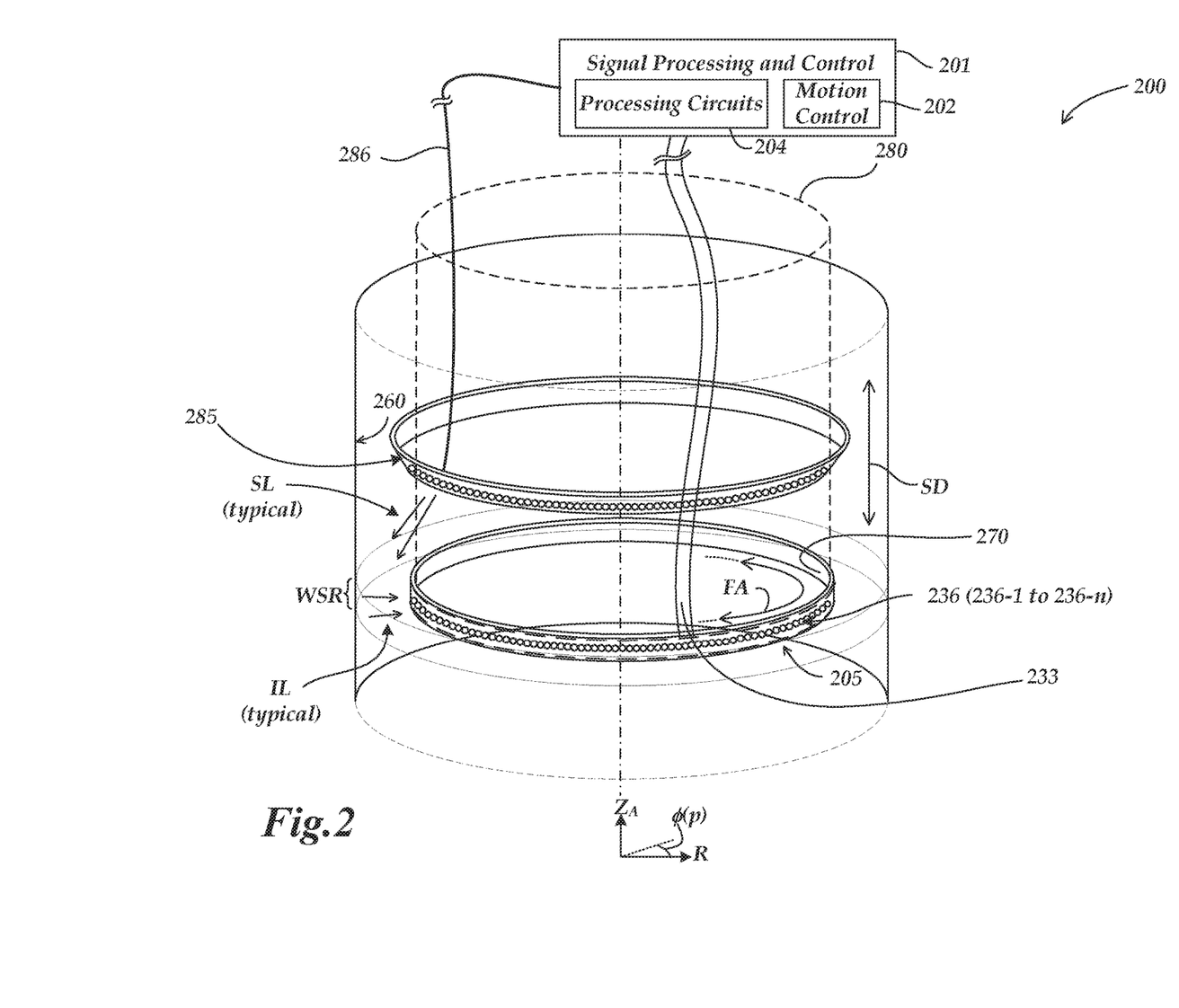
FIG. 2 is a diagram of a second exemplary implementation of a surface profiling system.

FIG. 2 is a diagram of a second exemplary implementation of a surface profiling system 200. It will be appreciated that the surface profiling system 200 may have certain characteristics that are similar to those of the surface profiling system 100 of FIG. 1, and will be understood to operate similarly except as otherwise described below. As shown in FIG. 2, the surface profiling system 200 includes a signal processing and control portion 201, an imaging and detector configuration 205, a curved carrier 270, a support portion 280 and an illumination portion 285. The imaging and detector configuration 205 is carried on the curved carrier 270. In various implementations, the imaging and detector configuration 205 includes an imaging detector array and an optical imaging array, portions or all of which may correspondingly be carried on the curved carrier 270 which may hold them in a stable form.

In various implementations, certain portions or all of the surface profiling system 200 may include and/or be carried on a schematically represented support portion 280 which holds certain portions in proper relationships and which may be mounted to or include a motion control system or the like (e.g., as controlled by the motion control portion 202) for scanning the imaging and detector configuration 205 along an axial scanning direction SD to image a desired axial workpiece surface region of a bore surface 260. In various implementations, either the imaging and detector configuration 205 or the bore surface 260 may be stationary, and the other may be moved in a manner measured and controlled by the surface profiling system 200, according to known methods. In various implementations, FIG. 2 is arranged according to cylindrical coordinates $Z_A$, R and $\phi$ which are aligned with the cylindrical bore, wherein $Z_A$ corresponds to an axial direction and $\phi$ (or "P") corresponds to the circumferential direction on the bore surface 260, and the axial scanning direction SD may generally correspond to the axial direction $Z_A$. As will be described in more detail below with respect to FIG. 3, the axial scanning direction SD may also correspond to an X or Y axis direction with respect to the relative coordinates of the imaging and detector configuration 205.

In various implementations the illumination portion 285 may include a strobe light source, controllable to determine an exposure duration and timing (e.g., a timing which is triggered at a particular imaging position, for example). The illumination portion 285 is connected to an illumination power and control element, which may be provided as part of or in connection with the signal processing and control portion 201, via an illumination/control line 286. In operation, the illumination portion 285 is arranged to provide source light SL to a workpiece surface region WSR on the bore surface 260. In alternative implementations, an illumination portion may be omitted, or provided as part of the imaging and detector configuration 205, or otherwise provided on the carrier 270, or in any other convenient form. In any case, the source light SL is reflected from the workpiece surface region WSR as image light IL that is received by optical channels 236 of the optical imaging array of the imaging and detector configuration 205.

As previously indicated, generally speaking a surface profiling system according to principles disclosed herein may comprise a set of detector pixels arrayed generally along the direction of a first array axis and an optical imaging array including at least one set of optical channels, wherein the optical channels in a set are arrayed generally along the direction of the first array axis and each optical channel is configured with its optical axis arranged transverse to the first array axis to input image light from a workpiece surface region located at an object distance along its optical axis in its field of view (FOV) and transmit the image light to a plurality of pixels of the imaging detector array located in its imaged field of view (IFOV). In the specific example shown in FIG. 2, the first array axis FA follows a circular path, and the optical imaging array of the imaging and detector configuration 205 may include at least one set of optical channels configured with their optical axes aligned along respective radial directions transverse to the circular path. The at least one set of optical channels may be arrayed generally along the direction of the circular first array axis FA which may generally correspond to the direction of the circumference of the cylindrical bore. As noted above, the surface profiling system 200 may be configured to move the carrier 270 to cause the imaging and detector configuration 205 to scan along a workpiece surface region WSR of the bore surface 260 in the scan direction SD (along the direction of the cylinder axis).

In various implementations, the optical imaging array of the imaging and detector configuration 205 includes optical channels 236-1 to 236-$n$ having optical axes radially aligned transverse to the circular first array axis FA, for which optical channels 236-1 to 236-$n$ are arrayed generally along the circular direction of a first array axis FA. FIG. 2 illustrates the ends of the optical channels 236 as facing toward the bore surface 260. As will be described in more detail below with respect to FIG. 3, each optical channel 236 is configured to input image light IL from a workpiece surface region WSR of the bore surface 260 located at an object distance along its optical axis in its field of view FOV and transmit the image light IL to a plurality of pixels of the imaging detector array of the imaging and detector configuration 205 located in its imaged field of view IFOV.

As will further be described in more detail below with respect to FIG. 3, the imaging detector array of the imaging and detector configuration 205 includes at least one set of detector pixels (not shown) arrayed generally along the circular direction of a first array axis FA. In various implementations, the pixels are formed of photodetector elements that provide image data (e.g., intensity values), which may be output individually, or in parallel, or multiplexed, or serialized, or otherwise processed before being output on connections 233. That is, in some implementations, the signal processing and control portion 201 may include processing circuits 204 that are provided as part of the imaging detector array 310 (FIG. 3) and/or on the carrier 270 and which provide signals to other processing circuits 204 and/or other portions of the signal processing and control portion 201 via the connections 233. In other implementations, the processing circuits 204 may be provided separately from the carrier 270 and/or the imaging detector array of the imaging and detector configuration 205, and may receive pixel signals from the imaging detector array via the connections 233.

In the implementation shown in FIG. 2, the imaging and detector configuration 205 is curved in an approximately circular shape on the carrier 270. In some implementations, the carrier 270 may be a portion of the support portion 280. In various implementations, portions of the imaging and detector configuration 205 may be formed on a substrate that may be a flex print, an elastomer or a thinned semiconductor substrate, or another curvable substrate that provides the required properties (e.g., for providing a curved optical imaging array, etc.). In some implementations, the optical imaging array of the imaging and detector configuration 205 may be formed of a flexible IC sensor such as a FleX™ Silicon-on-Polymer™ CMOS sensor available from American Semiconductor of Boise, Id., or a curved high-resolution CCD sensor provided by Andanta of Olching, Germany. Various other usable alternatives for fabricating a curved optical imaging array configuration are disclosed in U.S. Pat. Nos. 6,791,072; 6,849,843; 7,786,421; 8,372,726; 8,742,325; and U.S. Patent Publications 2010/0264502 and 2012/0261551, all of which are hereby incorporated herein by reference in their entirety.

In some implementations, the optical imaging array of the imaging and detector configuration 205 may comprise multiple imaging arrays which are each nominally flat over a limited span, but are arranged along a curved form of the optical imaging array. For example, a plurality of nominally flat imaging arrays may be provided on a flexible substrate that extends along the curved form of the optical imaging array. One design consideration in such an implementation is that each of the imaging arrays should not receive an unacceptably blurred image of its corresponding portion of a workpiece surface region WSR. Thus, any corresponding portions of the optical imaging array and corresponding optical channels (e.g., each including a lens arrangement) should be designed to have complementary curvatures to the extent required to maintain each pixel within a desirable image focus depth or range.

Figure 3:
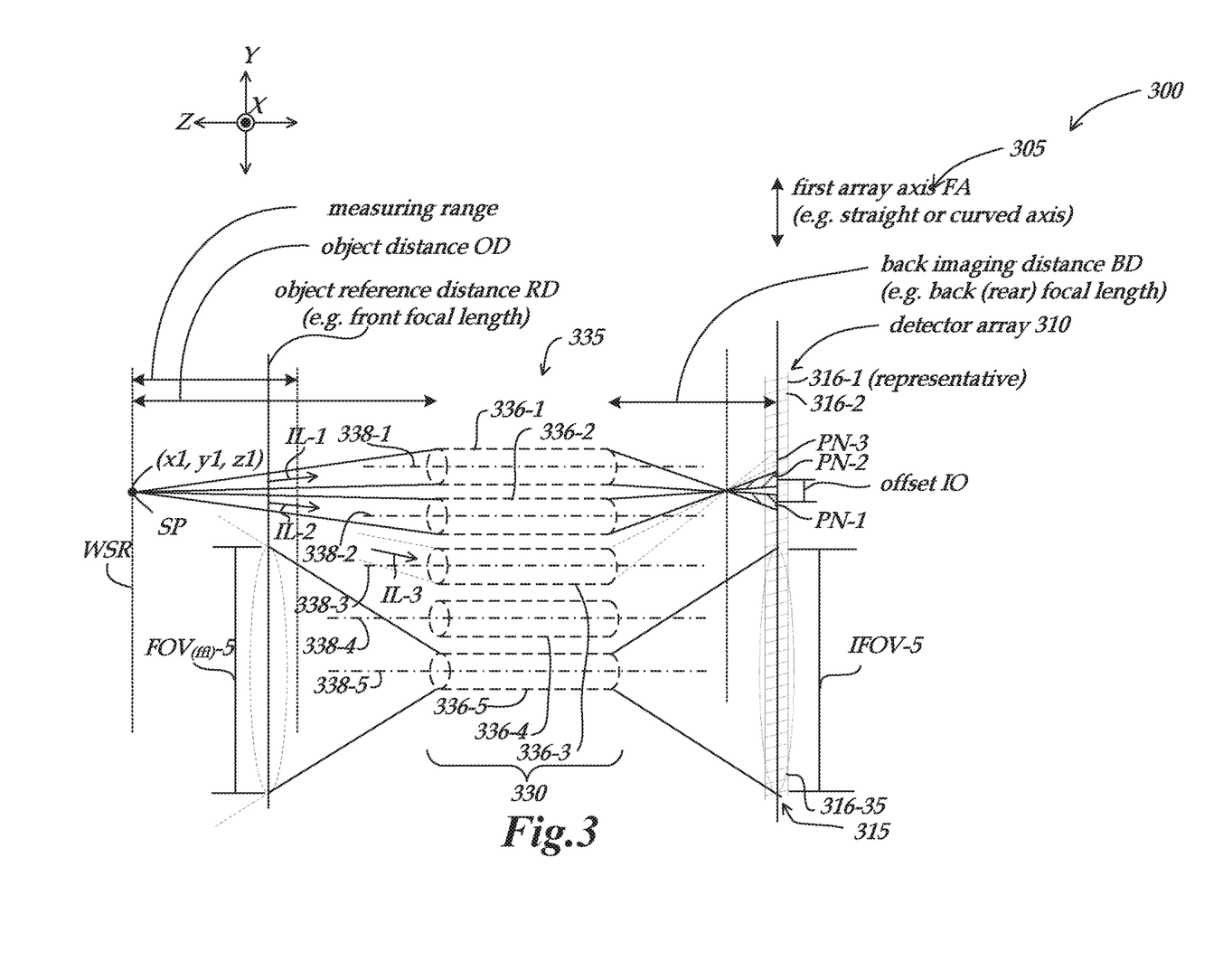
FIG. 3 is a diagram showing various operational aspects of one exemplary implementation of an imaging detector array and an optical imaging array as included in a surface profiling system.

FIG. 3 is a diagram of one exemplary implementation of a surface profiling system 300 including an imaging and detector configuration 305 having an imaging detector array 310 and an optical imaging array 330. It will be appreciated that the surface profiling system 300 may have similar characteristics and will be understood to operate similarly to the surface profiling systems 100 and 200, except as otherwise described below. In various implementations, the imaging detector array 310 includes at least one set 315 of detector pixels 316 arrayed generally along a direction of a first array axis FA, which may be understood to represent a straight first array axis (as in FIG. 1), or a segment of a curved or circular first array axis (as in FIG. 2). In the implementation of FIG. 3, example detector pixels 316-1 to 316-35 are illustrated as part of the imaging detector array 310. In various implementations, the optical imaging array 330 includes at least one set 335 of optical channels 336, wherein the optical channels in a set are arrayed generally along the direction of the first array axis FA, and each optical channel is configured with its optical axis 338 arranged transverse to the first array axis to input image light from a workpiece surface region located at an object distance along its optical axis in its field of view (FOV) and transmit the image light to a plurality of pixels of the imaging detector array located in its imaged field of view (IFOV). In some embodiments, the optical axes may be approximately parallel. In the implementation of FIG. 3, example optical channels 336-1 to 336-5 having optical axes 338-1 to 338-5 are illustrated as part of the optical imaging array 330. It will be appreciated that the number of detector pixels 316 and optical channels 336 in the configuration of FIG. 3 are for purposes of illustration only, and that other implementations may have more or less detector pixels and/or optical channels, depending on the implementation.

Each optical channel 336 is configured to input image light IL from a workpiece surface region WSR (e.g., of a bore surface) located at an object distance OD along a direction of an optical channel's optical axis 338 in the optical channel's field of view FOV, and transmit the image light IL to a plurality of pixels 316 of the imaging detector array 310 located in the optical channel's imaged field of view IFOV. In various implementations, the surface profiling system 300 further includes one or more light sources (not shown) that provide source light directed toward the workpiece surface region WSR, wherein the source light is reflected from the workpiece surface region WSR as the image light IL that is received by the lens arrangement of each optical channel 336 that is configured to provide an erect image of at least a portion of the workpiece surface region WSR in its imaged field of view IFOV (e.g., the optical channel 336-1 receives image light IL-1, the optical channel 336-2 receives image light IL-2, etc.). In various implementations, the imaging detector array 310 is configured to provide at least M pixels 316 that are located in an optical channel 336 imaged field of view IFOV, where M is an integer that is at least a minimum amount (e.g., 10, 25, 50, 100, etc.). It will be appreciated that the larger M is, the better the resolution with which the respective image offset IO corresponding to an imaged surface point can be determined. Generally speaking, the better the resolution of the determination of image offset IO, the better the resolution of the corresponding surface point height measurement.

In FIG. 3, for simplicity only a single field of view FOV and imaged field of view IFOV are illustrated for only a single optical channel (i.e., optical channel 336-5 is illustrated with the FOV-5 and IFOV-5), although it will be appreciated that each of the optical channels has a similar corresponding field of view FOV and imaged field of view IFOV, which overlap with one another, as will be described in more detail below.

The detector pixels 316 of the imaging detector array 310 are arranged at a back imaging distance BD from the optical channels 336. In various implementations, the back imaging distance BD may be made to be approximately equal to a back focal length of the optical channels 336, and/or an object reference distance RD may be made to be approximately equal to a front focal length of the optical channels 336, such as may provide certain advantages depending on the implementation. In some embodiments, the front and back focal lengths and/or the back imaging distance BD and the object reference distance RD may be equal. However, it will be appreciated that other combinations of back imaging distance BD and object reference distance RD may operate according to the principles outlined herein, and that these examples are illustrative only, and not limiting.

Each optical channel 336 includes a lens arrangement (e.g., as will be described in more detail below with respect to FIG. 4) configured to provide an erect image in its imaged field of view IFOV for a workpiece surface WS located in its FOV and within a measuring range along the direction of the optical axes of the surface profiling system 300.

The optical channels 336 are configured in the optical imaging array 330 to have overlapping fields of view FOV and overlapping imaged fields of view IFOV. In various implementations, the optical channels 336 may be adjacent to one another along the direction of the first array axis FA. In various implementations, it may be advantageous if the optical channels 336 have a nominal channel dimension along the direction of the first array axis of at most 500 micrometers (although this dimension is exemplary only, and not limiting).

In various desirable implementations, a measuring range of the surface profiling system 300 may be at least 50 micrometers along the direction of the optical axis 338 (e.g., along a Z axis), and the optical imaging array may have a dimension of at least 5 mm along the first array axis FA (e.g., along a Y axis). Of course, the measuring range may be any operable range less than or more than 50 micrometers (e.g., 100 micrometers or more, in some implementations) and the optical imaging array and imaging detector array may be much longer than 5 mm along the first array axis FA (e.g., 1 meter or more, in some implementations), if desired for a particular application. In bore inspection operations using a configuration such as that shown in FIG. 1, for example, a dimension along the first array axis FA that is at least as long as the bore height is advantageous for throughput, such that a single revolution of the scanning mechanism allows imaging of an entire bore surface.

A dimension of the surface profiling system perpendicular to the first array axis FA (e.g., along an X axis) may be minimal in a one-dimensional system (e.g., comprising only 1 row or set of optical channels and 1 row or set of detector pixels). It will be appreciated that the surface profiling system and/or workpiece surface may be scanned relative to one along a direction transverse to the first array axis, in order to create a two-dimensional profile map of a workpiece surface. Therefore, it is a design choice whether or not to include a plurality of sets (rows) of optical channels and/or detector pixels along a direction perpendicular to the first array axis FA.

In various implementations, the measuring range may include the object reference distance RD of the N optical channels 336. In various implementations, the measuring range (which may be defined by operating specifications of the surface profiling system, and/or by inherent operating limitations of the optical configuration) may be asymmetrical about the object reference distance RD, if desired.

In various implementations, a workpiece surface point SP (e.g., located at coordinates X1, Y1, Z1) that is located in the measuring range of the surface profiling system 300 may be simultaneously imaged in at least N overlapping imaged fields of view IFOVs of N optical channels 336, where N is an integer that is at least a minimum amount (e.g., 2, 3, etc.).

In the example of FIG. 3, the workpiece surface point SP is illustrated as being imaged in the overlapping imaged fields of view IFOVs of at least the optical channels 336-1, 336-2, and potentially 336-3. In various implementations, the surface profiling system is configured according to known optical principles such that a surface point that is located at a defined object reference distance RD from the N optical channels 336 in the measuring range is imaged at the same respective position (e.g., the same pixel position) along the imaging detector array 310 in each of the N overlapping imaged fields of view IFOVs. For example, with respect to the configuration of FIG. 3, if the workpiece surface point SP were at the object reference distance RD relative to the ends of the optical channels 336, the workpiece surface point SP would be imaged by each of the N optical channels 336 at the same position (e.g., the same pixel position) along the detector array 310. In contrast, as illustrated in FIG. 3, when the workpiece surface point SP is located at an object distance OD that is different than the object reference distance RD, then the surface point SP is imaged at different respective positions at least along the direction of the first array axis FA (e.g., corresponding to the Y axis) in each of the N overlapping imaged fields of view IFOVs, wherein the difference between at least two respective imaged positions defines a respective image offset IO for the surface point SP.

In the example of FIG. 3, the surface point SP is thus shown as being imaged at the detector array 310 at the positions PN-1, PN-2 (and potentially PN-3) by the optical channels 336-1, 336-2 (and potentially 336-3), respectively, and a corresponding image offset IO is correspondingly determined (e.g., indicated by a difference between the positions PN-1 and PN-2). In various implementations, corresponding image data provided by the imaging detector array 310 may be acquired, and the image data may be analyzed to determine the respective image offset IO. In accordance with principles described herein, a surface height measurement coordinate (e.g., Z1) for the workpiece surface point SP along the direction of the optical axis (e.g., along the direction of the Z axis) may be determined and provided based at least in part on the determined respective image offset IO. Further examples of image offsets will be illustrated and described in more detail below with respect to FIGS. 5A and 5B. In various implementations, the surface profiling system 300 may be configured to have the imaging and detector configuration 305 scan along the workpiece surface region WSR in a direction that is transverse to the first array axis FA (e.g., in an X axis direction which may correspond to a φ or "P" circumferential direction on a bore surface as described above with respect to FIG. 1).

Figure 4:
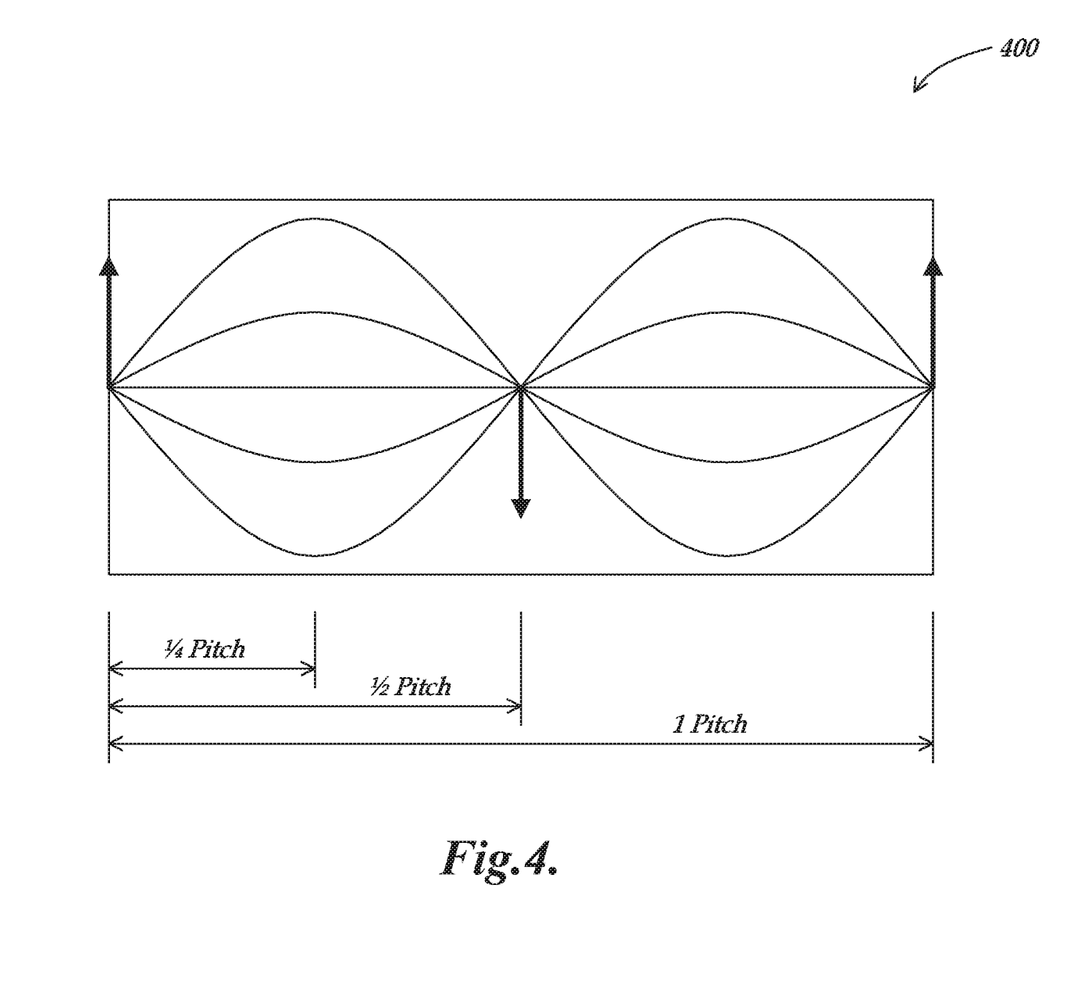
FIG. 4 is a diagram illustrating operation of a gradient-index (GRIN) lens as included in a lens arrangement of an optical channel of an optical imaging array.

FIG. 4 is a diagram illustrating operation of a gradient-index (GRIN) lens 400 such as may be included in the lens arrangement of an optical channel of an optical imaging array (e.g., in each of the optical channels 336 of FIG. 3). The travel of light rays through the GRIN lens 400 are illustrated and may be referenced according to a ¼ pitch, ½ pitch and 1 pitch. As illustrated, at a ½ pitch length of the GRIN lens 400, an inverted image is produced, while at a 1 pitch length of the GRIN lens 400, an erect image is produced. In various implementations, a GRIN lens 400 may be cut to a desired length to produce a desired image for a specific application (e.g., to produce an erect image). In various implementations, a GRIN lens that is included as the lens arrangement of an optical channel (e.g., an optical channel 336 of FIG. 3) may have a pitch length between ¾ and 1 along the optical axis (e.g., so as to produce an erect real image at the detector array 310.) In some implementations, the choice of pitch length in this range allows setting a back imaging distance BD to achieve a 1× imaging system necessary to minimize optical stitching effects resulting from the array of optical channels 336. In some implementations, the nominal object reference distance RD may be equal to BD. In some implementations, RD and/or BD may have example design values in the range 0.5 mm to 15 mm to allow noncontact measurement in small bore sizes. It will be appreciated that in various alternative implementations, the lens arrangement of an optical channel 336 may be made to include additional or alternative lenses (e.g., microlenses, etc.) arranged along the optical axis, which may be configured to produce an erect image at the detector array 310.

Figure 5A:
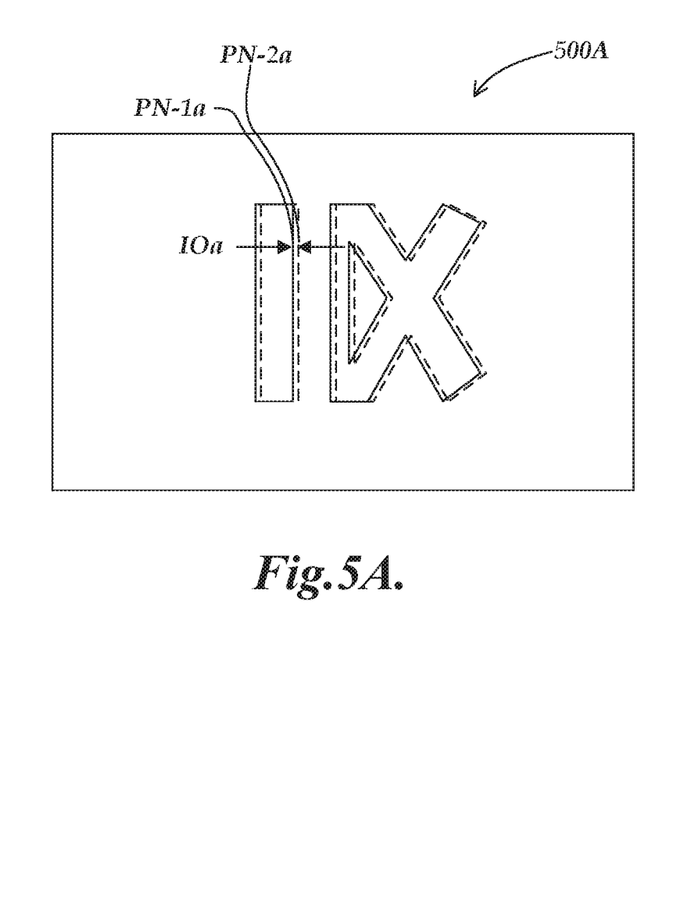
FIGS. 5A and 5B are diagrams of images illustrating discrete features of a workpiece surface as imaged at different respective object distances by a surface profiling system.
Figure 5B:
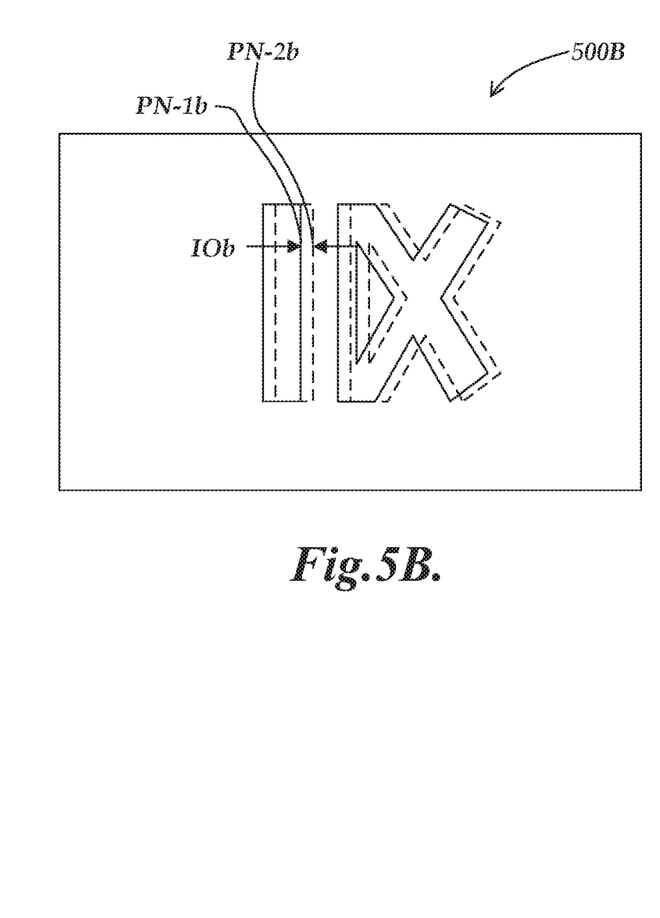

FIGS. 5A and 5B are diagrams of images 500A and 500B illustrating discrete features of a workpiece as imaged at different respective object distances OD by a surface profiling system. In one implementation the images 500A and 500B may be provided by a surface profiling system that includes a plurality of sets of optical channels and many sets of detector pixels, in order to provide a two-dimensional image. In other implementations, the two-dimensional image could be provided by scanning a surface profiling system relative to the workpiece along a direction transverse to the first array axis of a single set of optical channels and/or detector pixels, and forming a composite image from multiple scanned "one-dimensional" image data.

With respect to the images 500A and 500B, in various implementations a workpiece surface point may be one of a number of surface points located along a discrete feature of a workpiece surface region. For certain workpiece configurations, such edges may be oriented transverse to the first array axis, such that as described above when the discrete feature is located at an object distance OD that is different than the object reference distance of the N optical channels (e.g., optical channels 336 of FIG. 3), each workpiece surface point of the discrete feature may be imaged at different respective positions along the imaging detector array in each of the N overlapping IFOVs. In the particular examples of FIGS. 5A and 5B, the images 500A and 500B are produced by a surface profiling system that is approximately 250 um and 500 um, respectively, away from best focus relative to the workpiece surface. More specifically, the illustrated discrete features in the images 500A and 500B are located at an object distance that is different than the object reference distance of the optical channels of an imaging and detector configuration by approximately 250 um and 500 um, respectively. In various implementations, as previously indicated, the two-dimensional images 500A and 500B may be reconstructed images formed by combining image data from a scan by a one-dimensional imaging and detector configuration (e.g., the configurations of FIGS. 3, 6A and 6B), as will be described in more detail below.

In various implementations, it may be desirable for the system to utilize a measuring range wherein a difference between the object distance and the object reference distance of the N optical channels (e.g., an out of focus amount) produces relatively clear images of the surface points/discrete features at the different respective positions (e.g., so that a respective image offset may be more accurately determined, etc.)

It will be appreciated that if, in the examples of FIGS. 5A and 5B, the out of focus amount was increased further (e.g., above the amount of approximately 500 um corresponding to FIG. 5B), the corresponding imaged feature separation or image offset IO between the imaged positions may continue to increase, although the blurriness of the imaged discrete features may also increase beyond a desirable level. In various implementations, contrast-based or other evaluation techniques may be utilized to evaluate image data and/or images (e.g., such as images 500A and 500B) produced by the system to determine a desirable out of focus level for the system to utilize (e.g., one that produces clear discrete feature images and/or separations for use in determining respective image offsets, etc.). In general, a separation or image offset IO greater than the in-focus spatial resolution of the system is desirable to resolve the separation. In one specific example implementation, the image 500B may represent a preferred out of focus level of 500 um in the measuring range at which the system may operate. It is noted that in the example of the image 500B, the difference between the respective imaged positions is relatively clear, such that the respective image offset may be determined with relatively high accuracy. For example, in various implementations, a surface profiling system formed in accordance with the principles disclosed herein may provide sensitivity for the determination of the surface height measurement coordinate in the range of 1 um as compared to 10 um, or approximately 10× accuracy improvement (e.g., due to the larger triangulation angles from the multiple spatially arranged optical channels 336) as compared to prior techniques (e.g., points from focus operations based on blurriness and utilizing a single large lens). It will further be appreciated that such characteristics allow a surface profiling system to be formed in a more compact configuration that may operate in constrained spaces (e.g., for scanning an interior bore surface) with a higher degree of accuracy for the determination of surface height measurement coordinates.

As shown in the image 500A, a discrete feature is imaged at different respective "image offset" positions PN-1$a$, PN-2$a$ corresponding to the image offset IOa, between two adjacent optical channels. The image offset amount IOa is due to a "relatively lesser" difference between an object distance (or surface height) of the indicated edge feature and the object reference distance of the surface profiling system. In comparison, as shown in the image 500B, the same discrete feature is imaged at different respective "image offset" positions PN-1$b$, PN-2$b$ corresponding to the image offset IOb, between two adjacent optical channels. The image offset amount IOb is due to a "relatively greater" difference between the object distance (or surface height) of the indicated edge feature and the object reference distance of the surface profiling system.

In any case, the various image offset amounts IO (e.g., in micrometers, or pixel units) corresponding to various object distances in the measuring range can be calibrated for the surface profiling systems, such that any image offset amount IO is quantitatively indicative of the difference between the object distance (or surface height) of a feature and the object reference distance of the surface profiling system. Thus, in various implementations, a surface height measurement coordinate (e.g., Z1) for the corresponding surface height of an imaged workpiece surface point or feature along the direction of the optical axis (e.g., along the direction of the Z axis) may be determined and provided based (at least in part) on its determined respective image offset IO.

It should be appreciated that the two images 500A and 500B show a workpiece feature at two different heights corresponding to the image offsets IOa and IOb respectively, in order to illustrate the operative measurement principle disclosed herein. However, in the general case, only one image of a surface is needed, and each respective feature in that image will have a respective image offset IO, such that a three-dimensional surface map may be determined based for that surface region included in that image.

In various implementations, the analyzing of the image data (e.g., by the signal processing and control portion 101 of FIG. 1) to determine the respective image offset IO may include at least one of Fourier analysis of spatial frequencies, auto-correlation operations, etc. In various implementations, an analysis technique may be utilized that defines a point spread function as a function of surface height (e.g., as a function of Z). For example, for a one-dimensional function, a point spread function may be based on a specified number of imaged positions (e.g., two imaged positions) increasing in distance and size with Z. By deconvolution operations using known or predetermined point spread functions at different Zs with the image (e.g., to make an image stack), and then finding best contrast image portions from the image stack, an extended depth of field image and Z profile map may be constructed utilizing known techniques. The resulting process allows increased speed through use of one-dimensional point spread functions, with a one-dimensional imaging and detector configuration in a line scan type system (e.g., utilizing the imaging and detector configuration of FIG. 3 for performing line scan type operations such as those described above).

In various implementations, the analyzing of the image data to determine the respective image offset may also or alternatively include utilizing a video tool to determine a distance between the respective positions that the surface point/discrete feature is imaged at. For example, with respect to the image 500B, one or more video tools may be utilized determine the positions PN-1$b$ and PN-2$b$ of the imaged discrete feature and/or the corresponding image offset distance between the positions PN-1$b$ and PN-2$b$. More specifically, some systems may include GUI features and predefined image analysis "video tools" such that operation and programming can be performed by "non-expert" operators. For example, U.S. Pat. No. 6,542,180, which is hereby incorporated herein by reference in its entirety, teaches a system that uses automated video inspection including the use of various video tools. Exemplary video tools may include edge location tools, which are sometimes referred to as "box tools," which may be used to locate an edge that defines a discrete feature of a workpiece (e.g., utilized to determine the positions PN-1$b$ and PN-2$b$ of the imaged discrete feature). For example, commonly assigned U.S. Pat. No. 7,627,162, which is hereby incorporated herein by reference in its entirety, teaches various applications of box tools.

In various implementations, a signal processing and control portion (e.g., see FIG. 1) may further be configured to perform operations comprising determining contrast based Z-height information for at least a portion of the workpiece surface region. For example, in addition to determining surface height measurement coordinates for surface points/discrete features based on determined image offsets, more traditional contrast based Z-height determination techniques may also or alternatively be utilized for determining the Z-height of a portion of a workpiece surface region. In various implementations, such contrast based Z-height determination techniques may be implemented through utilization of certain types of video tools (e.g., autofocus and/or focus height determination video tools, etc.). For example, commonly assigned U.S. Pat. No. 8,111,938, which is hereby incorporated herein by reference in its entirety, teaches various applications of autofocus video tools that utilize contrast based Z-height determination techniques.

In various implementations, certain of the above noted techniques may be utilized in combination with motion control that may be utilized to scan at known and desired spacing transverse to the first array axis, such that the "pixel coordinates" in combination with the motion control position coordinates allow the reconstruction of a two-dimensional image if desired (e.g., such as may be utilized to form the images 500A and 500B). In various implementations, an image offset may be analyzed along either or both directions of the reconstructed image, and the Z coordinate for a particular XY coordinate can be determined from the X or Y offset, or a combination thereof. Alternatively, the Y coordinate along the first array axis and the associated Z coordinate based on the image offset can be determined for each scan position (e.g., the X coordinate position, as determined by rotary encoder on scan arm 174 or other external sensor), and that data for multiple scan positions may be combined into a three-dimensional surface profile or map, without the intermediate step of assembling the individual scan image data into two-dimensional image data.

In various implementations, a two-dimensional image that is assembled may be displayed by the surface profiling system. The two-dimensional image may also be "de-blurred" if desired, by compensating or removing the local offset at local regions throughout the two-dimensional reconstructed image. In various implementations, if a two-dimensional imaging and detector configuration is utilized (e.g., having multiple columns of optical channels), then a detected two-dimensional image that corresponds to the size of the imaging detector array may be acquired without requiring motion and reconstruction. Once a detected or constructed two-dimensional image is provided, it may be analyzed using any method disclosed herein or otherwise known. As previously noted, the two-dimensional image may be analyzed to provide surface height information (e.g., resulting in three-dimensional surface profile data). The image may also be deblurred as described herein, to provide an extended depth of field (EDOF) image for viewing. Such an EDOF image maybe helpful for defect inspection, in various implementations.

In various implementations, a two-dimensional image may not be required depending on the nature of the designated output of the system. For example, if a cylindrical bore is being inspected to determine if there are defects in the cylindrical bore (e.g., inspecting for form errors or surface defects along the interior surface, etc.), an output provided by the system may primarily indicate whether or not the current cylindrical bore is free of defects or otherwise passes a designated inspection analysis. In such an implementation, as the surface height measurement coordinates are determined for the workpiece surface points on the interior bore surface, a warning or other indicator may be provided if a certain number of the surface height measurement coordinates are determined to deviate from expected values (e.g., if the interior surface of the cylindrical bore includes an unexpected number or depth of form errors or surface defects, etc.). In various implementations, such determinations may also be made based on a relative comparison between determined surface height measurement coordinates (e.g., wherein deviations among certain of the determined surface height measurement coordinates, such as in a given column, may indicate an unsmooth or otherwise defective interior bore surface, etc.)

Figure 6A:
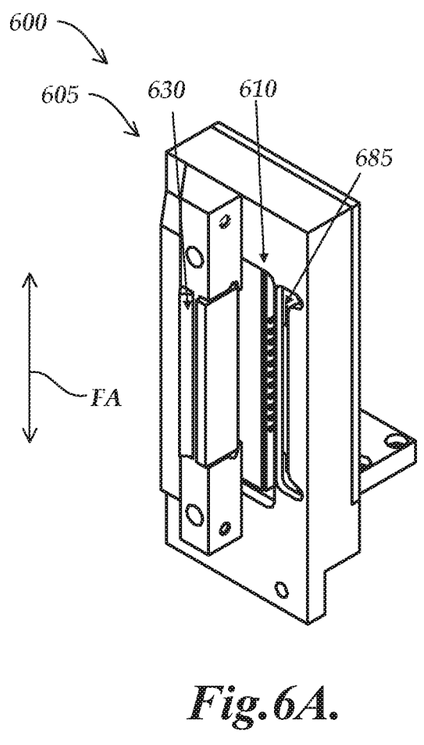
FIGS. 6A and 6B are diagrams of one exemplary implementation of an imaging and detector configuration of a surface profiling system as including an imaging detector array and an optical imaging array.
Figure 6B:
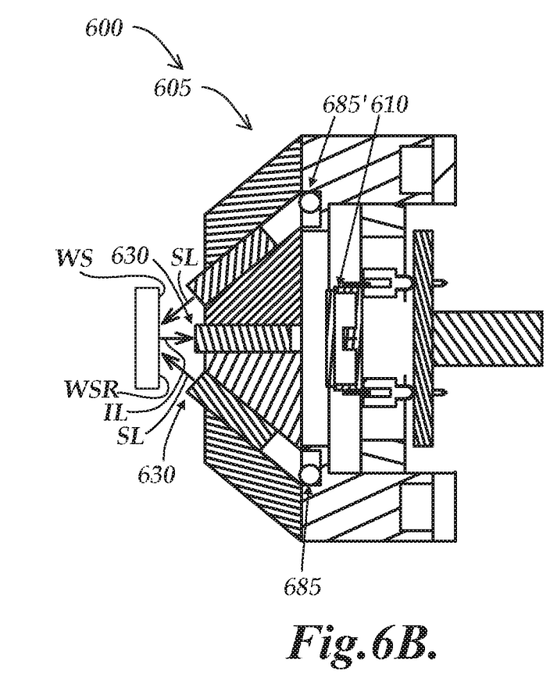

FIGS. 6A and 6B are diagrams of one exemplary implementation of an imaging and detector configuration 605 of a surface profiling system 600. It will be appreciated that the surface profiling system 600 may have similar characteristics and will be understood to operate similarly to the surface profiling systems 100, 200 and 300, except as otherwise described below. As shown in FIGS. 6A and 6B, the imaging and detector configuration 605 includes an imaging detector array 610, an optical imaging array 630 and light source arrays 685 and 685'.

In various implementations, the light source arrays 685 and 685' may each include an array of individual light sources (e.g., LEDs, etc.). In various implementations, each of the light source arrays 685 and 685' may provide source light SL directed toward a workpiece surface region WSR, wherein the source light SL may be reflected from the workpiece surface region WSR as image light IL that is received by the lens arrangement of each optical channel of the optical imaging array 630 that is configured to provide an erect image of at least a portion of the workpiece surface region WSR in its imaged field of view IFOV. In various implementations, the surface profiling system 600 may be configured to have the imaging and detector configuration 605 scan along the workpiece surface region WSR in a direction that is transverse to a first array axis FA (e.g., in an X axis direction which may correspond to a $\phi$ or "P" circumferential direction on a bore surface as described above with respect to FIG. 1).

In various implementations, the imaging and detector configuration 605 may include only a single set of detector pixels in the imaging detector array 610 and a single set of optical channels in the optical imaging array 630 in a one-dimensional configuration of the surface profiling system 600. In various alternative implementations, an imaging and detector configuration may include multiple sets of detector pixels in an imaging detector array and/or multiple sets of optical channels in an optical imaging array in a multi-dimensional configuration of a surface profiling system. For example, in a two-dimensional configuration, an imaging detector array may include multiple sets (e.g., columns) of detector pixels arrayed generally along the direction of a first array axis FA. In addition, a corresponding optical imaging array may include multiple sets (e.g., columns) of optical channels having parallel optical axes, wherein each of the sets of optical channels may be arrayed generally along the direction of a first array axis FA. Each optical channel may be configured to input image light from a workpiece surface region located at an object distance along its optical axis in its field of view FOV and transmit the image light to a plurality of pixels of the imaging detector array located in its imaged IFOV. In such a configuration, the multiple sets of detector pixels and the multiple sets of optical channels may each be arrayed along a second array axis (e.g., in an X axis direction) that is transverse to the first array axis FA (e.g., each set being arranged in a respective column wherein the columns are arranged along the second array axis, etc.). Stated another way, the imaging detector array 610 may include a plurality of similar sets of detector pixels, and the optical imaging array 630 may include a plurality of similar sets of optical channels, and the plurality of sets of detector pixels may be arranged adjacent to one another and the plurality of sets of optical channels may be arranged adjacent to one another, along a second array axis that is transverse to the first array axis FA.

It will be appreciated that in various implementations, multiple surface profiling systems and/or imaging and detector configurations (e.g., such as the surface profiling system 600 and/or the imaging and detector configuration 605) may be utilized in combination. For example, multiple imaging and detector configurations may be arranged relative to one another in a specified configuration. In one specific implementation, an arrangement of first and second imaging and detector configurations may correspond to a V-shape (e.g., in a "triangulation" three-dimensional imaging configuration). For example, the optical imaging array of the first imaging and detector configuration may be arranged relative to the optical imaging array of the second imaging and detector configuration in a V-shape, as illustrated. Stated another way, a surface profiling system may comprise a first profiling subsystem that includes a first imaging detector array and a first optical imaging array corresponding to a straight first array axis that is approximately straight. It may further comprise a second profiling subsystem similar to the first profiling subsystem. The optical axes of the first profiling subsystem may approximately align with a first plane, and the optical axes of the second profiling subsystem approximately align with a second plane, and the first and second planes may intersect at a line approximately parallel to their respective first array axes, and form an angle in a plane transverse to their respective first array axes. The signal processing and control portion may be configured to use image data provided by the first and second profiling subsystems in combination to perform a three-dimensional measurement operation. It will be appreciated that in accordance with principles disclosed herein, such surface profiling systems may be made smaller than traditional surface profiling systems, which also allows for smaller combined implementations to be produced.

Figure 7:
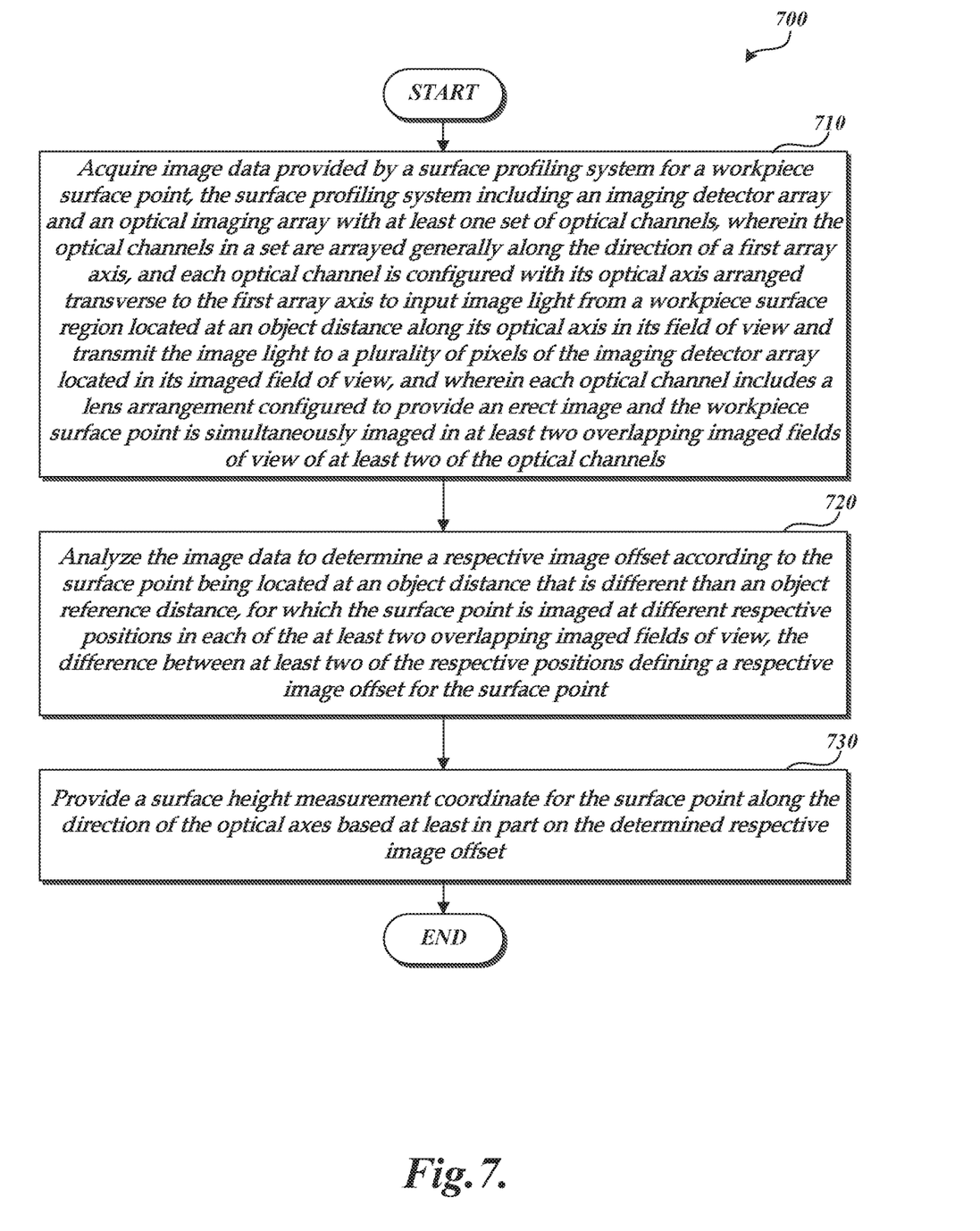
FIG. 7 is a flow diagram illustrating one exemplary implementation of a routine for acquiring and analyzing image data provided by a surface profiling system to determine a surface height measurement coordinate for a workpiece surface point.

FIG. 7 is a flow diagram illustrating one exemplary implementation of a routine 700 for acquiring and analyzing image data provided by a surface profiling system to determine a surface height measurement coordinate for a workpiece surface point. At a block 710, image data is acquired as provided by a surface profiling system for a workpiece surface point. As described above, the surface profiling system may include an imaging detector array and an optical imaging array with at least one set of optical channels, wherein the optical channels in a set are arrayed generally along the direction of a first array axis, and each optical channel is configured with its optical axis arranged transverse to the first array axis to input image light from a workpiece surface region located at an object distance along its optical axis in its field of view and transmit the image light to a plurality of pixels of the imaging detector array located in its imaged field of view, and wherein each optical channel includes a lens arrangement configured to provide an erect image and the workpiece surface point is simultaneously imaged in at least two overlapping imaged fields of view of at least three of the optical channels.

At a block 720, the image data is analyzed (e.g., by a signal processing and control portion) to determine a respective image offset according to the surface point being located at an object distance that is different than an object reference distance, for which the surface point is imaged at different respective positions in each of the at least two overlapping imaged fields of view. As described above, in certain implementations the difference between at least two of the respective positions may define a respective image offset for the surface point. In some implementations, a difference between two (or more) of the respective positions may define a respective image offset for the surface point (e.g., in an implementation utilizing a point spread function, etc.). At a block 730, a surface height measurement coordinate is provided (e.g., by a signal processing and control portion) for the surface point along the direction of the optical axes based at least in part on the determined respective image offset. In various implementations, the analyzing of the image data to determine the respective image offset may include at least one of Fourier analysis of spatial frequencies, auto-correlation operations, point spread functions, video tool operations, etc.

While preferred implementations of the present disclosure have been illustrated and described, numerous variations in the illustrated and described arrangements of features and sequences of operations will be apparent to one skilled in the art based on this disclosure. Various alternative forms may be used to implement the principles disclosed herein. Although bore scanning implementations have been emphasized in various system figures, it will be appreciated that these examples are illustrative only, and not limiting. For example, "planar" or flat panel surface scanning implementations may be provided based on the principles disclosed herein. In addition, the various implementations described above can be combined to provide further implementations. All of the U.S. patents and U.S. patent applications referred to in this specification are incorporated herein by reference, in their entirety. Aspects of the implementations can be modified, if necessary to employ concepts of the various patents and applications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled.

What is claimed is:

1. A surface profiling system comprising:
   an imaging detector array including at least one set of detector pixels arrayed along a direction of a first array axis; and
   an optical imaging array including at least a first set of optical channels, wherein the first set of optical channels includes at least first and second optical channels and the optical channels in the first set are arrayed along the direction of the first array axis, each optical channel configured with its optical axis arranged transverse to the first array axis to input image light from a workpiece surface region of a workpiece surface located at an object distance along its optical axis in its field of view (FOV) and to transmit the image light to a plurality of pixels of the imaging detector array located in its imaged field of view (IFOV);
   wherein:
   the detector pixels of the imaging detector array are arranged at a back imaging distance from the optical channels;
   each optical channel comprises a lens arrangement comprising a lens configured to provide an erect image in its IFOV for a workpiece surface located in its FOV and within a measuring range along a direction of the optical axes of the surface profiling system, for which the first optical channel has a first IFOV and a first FOV and comprises a first lens arrangement comprising a first lens configured to provide an erect image in the first IFOV for a workpiece surface located in the first FOV, and the second optical channel has a second IFOV and a second FOV and comprises a second lens arrangement comprising a second lens configured to provide an erect image in the second IFOV for a workpiece surface located in the second FOV, wherein the first lens arrangement does not include the second lens and the second lens arrangement does not include the first lens;
   the optical channels in the first set are configured in the optical imaging array to have overlapping FOVs and overlapping IFOVs, wherein:
   a workpiece surface point located in the measuring range is simultaneously imaged in at least the first and second overlapping IFOVs of the first and second optical channels; and
   when a surface point is located at a defined object reference distance from the first and second optical channels in the measuring range, then the surface point is imaged by both the first and second optical channels at the same position along the imaging detector array as the surface point is imaged in each of the first and second overlapping IFOVs, and a surface point that is located at an object distance that is different than the object reference distance is imaged by the first optical channel at a first position and is imaged by the second optical channel at a second position, for which the first and second positions are different respective positions along the imaging detector array at least along the direction of the first array axis in each of the first and second overlapping IFOVs, for which the difference between the object distance and the object reference distance corresponds to an out of focus amount that produces the imaging of the surface point at the first and second positions along the imaging detector array and for which a difference between at least the first and second positions defines a respective image offset for the surface point; and
   the surface profiling system further uses a signal processing and control portion to perform operations comprising:
   controlling the motion control portion to
   move at least one of the workpiece surface relative to the optical imaging array or the optical imaging array relative to the workpiece surface so as to cause the optical imaging array to scan along the workpiece surface in a direction transverse to the first array axis to acquire image data for the workpiece surface region;
   acquiring image data provided by the imaging detector array while the optical imaging array scans along the workpiece surface in the direction transverse to the first array axis;
   analyzing the image data to determine the respective image offset for the surface point that is located at an object distance that is different than the object reference distance for which the difference between the object distance and the object reference distance corresponds to an out of focus amount that produces the imaging of the surface point at the different respective positions along the imaging detector array and for which the respective image offset is defined by the difference between at least the first and second respective positions at which the surface point is imaged along the imaging detector array;
   providing a surface height measurement coordinate for the surface point along the direction of the optical axes based at least in part on the determined respective image offset;
   analyzing the image data to determine respective image offsets for a plurality of additional surface points that are scanned by the optical imaging array along the workpiece surface in the direction transverse to the first array axis; and providing a surface height measurement coordinate for each of the plurality of additional surface points along the direction of the optical axes based at least in part on the determined respective image offsets.

2. The surface profiling system of claim 1, wherein the back imaging distance is equal to a back focal length of the optical channels, and the object reference distance is equal to a front focal length of the optical channels.

3. The surface profiling system of claim 1, wherein the measuring range is at least 50 micrometers, and the optical imaging array has a dimension of at least 5 mm along the first array axis.

4. The surface profiling system of claim 1, wherein the surface point is one of a plurality of first array axis surface points that are imaged in an area extending along the direction of the first array axis while the optical imaging array is at a first position relative to the workpiece surface, and the signal processing and control portion is further configured to perform operations comprising determining respective surface height measurement coordinates for each of the plurality of first array axis surface points based at least in part on determined respective image offsets for each of the plurality of first array axis surface points.

5. The surface profiling system of claim 1, wherein the signal processing and control portion is further configured to perform operations comprising constructing a synthetic image wherein respective image offsets corresponding to a plurality of surface points are at least one of a) compensated or b) removed, and a majority of the synthetic image appears focused.

6. The surface profiling system of claim 1, wherein: the first set of optical channels further includes a third optical channel;
the third optical channel has a third IFOV and a third FOV and comprises a third lens arrangement comprising a third lens configured to provide an erect image in the third IFOV for a workpiece surface located in the third FOV, wherein the first and second lens arrangements do not include the third lens and the third lens arrangement does not include the first or second lenses;
a workpiece surface point located in the measuring range is simultaneously imaged in at least the first, second and third overlapping IFOVs of the first, second and third optical channels; and
when a surface point is located at a defined object reference distance from the first, second and third optical channels in the measuring range, then the surface point is imaged by each of the first, second and third optical channels at the same position along the imaging detector array as the surface point is imaged in each of the first, second and third overlapping IFOVs, and a surface point that is located at an object distance that is different than the object reference distance is imaged by the third optical channel at a third position, for which the first, second and third positions are different respective positions along the imaging detector array at least along the direction of the first array axis in each of the first, second and third overlapping IFOVs, for which the difference between the object distance and the object reference distance corresponds to an out of focus amount that produces the imaging of the surface point at the different respective positions along the imaging detector array.

7. The surface profiling system of claim 1, wherein the imaging detector array is configured to provide at least M pixels that are located in an optical channel IFOV, where M is an integer that is at least 50.

8. The surface profiling system of claim 1, wherein the analyzing of the image data to determine the respective image offset comprises at least one of Fourier analysis of spatial frequencies or auto-correlation operations.

9. The surface profiling system of claim 1, wherein:
the imaging detector array includes a plurality of similar sets of detector pixels;
the optical imaging array includes a plurality of similar sets of optical channels; and
the plurality of sets of detector pixels are arranged adjacent to one another and the plurality of sets of optical channels are arranged adjacent to one another, along a second array axis that is transverse to the first array axis.

10. The surface profiling system of claim 1, wherein the measuring range is asymmetrical about the object reference distance, along the direction of the optical axes.

11. The surface profiling system of claim 1, wherein each of the first and second lenses comprises a GRIN lens.

12. The surface profiling system of claim 11, wherein each of the GRIN lenses has a pitch length of at least ¾ and at most 1 along its optical axis.

13. The surface profiling system of claim 1, wherein the optical channels have a nominal channel dimension along the direction of the first array axis of at most 500 micrometers.

14. The surface profiling system of claim 1, wherein the optical channels are adjacent to one another along the direction of the first array axis.

15. The surface profiling system of claim 1, wherein the first array axis is straight, and the optical channels are configured with their optical axes parallel to one another.

16. The surface profiling system of claim 15 wherein the imaging detector array and the optical imaging array form a first profiling subsystem, and the surface profiling system further comprises a second profiling subsystem similar to the first profiling subsystem,
wherein:
optical axes of the first profiling subsystem align with a first plane, and optical axes of the second profiling subsystem align with a second plane, and the first and second planes intersect at a line parallel to their respective first array axes, and form an angle in a plane transverse to their respective first array axes; and
the signal processing and control portion is further configured to use image data provided by the first and second profiling subsystems in combination to perform a three-dimensional measurement operation.

17. The surface profiling system of claim 1, wherein the first array axis follows a circular path, and the optical channels are configured with their optical axes aligned along respective radial directions transverse to the circular path.

18. The surface profiling system of claim 1, wherein the at least one set of detector pixels and the at least a first set of optical channels respectively correspond to only a single set of detector pixels and a single set of optical channels in a one-dimensional configuration of the surface profiling system.

19. The surface profiling system of claim 1, wherein the surface point is one of a plurality of surface points located along a discrete feature of the workpiece surface, and the discrete feature extends transverse to the direction of the first array axis on the workpiece surface and is located at an object distance that is different than the object reference distance such that the discrete feature is imaged at different respective positions along the imaging detector array in each of the first and second overlapping IFOVs, the difference between the respective positions defining a respective image offset for the discrete feature.

20. A computer-implemented method for operating a surface profiling system, the method comprising:
controlling a motion control portion of the surface profiling system to cause an optical imaging array of the surface profiling system to scan along a workpiece surface in a direction transverse to a first array axis, the surface profiling system comprising:
an imaging detector array including at least one set of detector pixels arrayed along the direction of the first array axis;
the optical imaging array which includes at least a first set of optical channels, wherein the first set of optical channels includes at least first and second optical channels and the optical channels in the first set are arrayed along the direction of the first array axis, each optical channel configured with its optical axis arranged transverse to the first array axis to input image light from a workpiece surface region of a workpiece surface located at an object distance along its optical axis in its field of view (FOV) and to transmit the image light to a plurality of pixels of the imaging detector array located in its imaged field of view (IFOV); and
wherein:
the detector pixels of the imaging detector array are arranged at a back imaging distance from the optical channels;
each optical channel comprises a lens arrangement comprising a lens configured to provide an erect image in its IFOV for a workpiece surface located in its FOV and within a measuring range along the direction of the optical axes of the surface profiling system, for which the first optical channel has a first IFOV and a first FOV and comprises a first lens arrangement comprising a first lens configured to provide an erect image in the first IFOV for a workpiece surface located in the first FOV, and the second optical channel has a second IFOV and a second FOV and comprises a second lens arrangement comprising a second lens configured to provide an erect image in the second IFOV for a workpiece surface located in the second FOV, wherein the first lens arrangement does not include the second lens and the second lens arrangement does not include the first lens;
the optical channels in the first set are configured in the optical imaging array to have overlapping FOVs and overlapping IFOVs, wherein:
a workpiece surface point located in the measuring range is simultaneously imaged in at least the first and second overlapping IFOVs of the first and second optical channels; and
when a surface point is located at a defined object reference distance from the the first and second optical channels in the measuring range, then the surface point is imaged by both the first and second optical channels at the same position along the imaging detector array as the surface point is imaged in each of the first and second overlapping IFOVs, and a surface point that is located at an object distance that is different than the object reference distance is imaged by the first optical channel at a first position and is imaged by the second optical channel at a second position, for which the first and second positions are different respective positions along the imaging detector array at least along the direction of the first array axis in each of the first and second overlapping IFOVs, for which the difference between the object distance and the object reference distance corresponds to an out of focus amount that produces the imaging of the surface point at the first and second positions along the imaging detector array and for which a difference between at least the first and second positions defines a respective image offset for the surface point;
the method further comprising:
controlling the motion control portion to move at least one of the workpiece surface relative to the optical imaging array or the optical imaging array relative to the workpiece surface so as to cause the optical imaging array to scan along the workpiece surface in a direction transverse to the first array axis to acquire image data for the workpiece surface region;
acquiring image data provided by the imaging detector array while the optical imaging array scans along the workpiece surface in the direction transverse to the first array axis;
analyzing the image data to determine the respective image offset for the surface point that is located at an object distance that is different than the object reference distance for which the difference between the object distance and the object reference distance corresponds to an out of focus amount that produces the imaging of the surface point at the different respective positions along the imaging detector array and for which the respective image offset is defined by the difference between at least the first and second respective positions at which the surface point is imaged along the imaging detector array;
providing a surface height measurement coordinate for the surface point along the direction of the optical axes based at least in part on the determined respective image offset;
analyzing the image data to determine respective image offsets for a plurality of additional surface points that are scanned by the optical imaging array along the workpiece surface in the direction transverse to the first array axis; and
providing a surface height measurement coordinate for each of the plurality of additional surface points along the direction of the optical axes based at least in part on the determined respective image offsets.

21. The surface profiling system of claim 1, wherein the workpiece surface region is located on a cylindrical bore surface and the motion control portion provides rotary movement to cause the optical imaging array to scan along the cylindrical bore surface in a direction transverse to the first array axis.

* * * * *